United States Patent [19]

Kataoka

[11] Patent Number: 5,173,369
[45] Date of Patent: Dec. 22, 1992

[54] TAPE CARRIER HAVING CONNECTION FUNCTION

[75] Inventor: Tatsuo Kataoka, Kawaguchi, Japan

[73] Assignee: Mitsui Mining & Smelting Co., Ltd., Tokyo, Japan

[21] Appl. No.: 600,535

[22] Filed: Oct. 19, 1990

[30] Foreign Application Priority Data

Oct. 30, 1989 [JP] Japan .................. 1-279859

[51] Int. Cl.[5] ............... H01L 21/60; H01L 23/48
[52] U.S. Cl. .................. 428/620; 428/624; 257/666; 257/735
[58] Field of Search ............ 357/69, 70; 428/607, 428/601, 687, 600, 624, 625, 626, 620, 596, 573

[56] References Cited

U.S. PATENT DOCUMENTS

| | | | |
|---|---|---|---|
| 4,027,326 | 5/1977 | Kummer et al. | 357/70 |
| 4,259,436 | 3/1981 | Tabuchi et al. | 430/314 |
| 4,308,339 | 12/1981 | Lindberg | 357/70 |
| 4,339,296 | 7/1982 | Gursky et al. | 156/345 |
| 4,367,123 | 1/1983 | Beck | 204/224 R |
| 4,396,457 | 8/1983 | Bakermans | 357/70 |
| 4,438,181 | 3/1984 | Schroeder | 357/70 |
| 4,549,941 | 10/1985 | Parthasarathi et al. | 205/111 |
| 4,551,210 | 11/1985 | Parthasarathi | 205/111 |
| 4,552,627 | 11/1985 | Parthasarathi | 205/111 |
| 4,878,990 | 11/1989 | Dugan et al. | 357/70 |
| 4,927,491 | 5/1990 | Masaki | 156/630 |
| 5,006,917 | 4/1991 | Kang et al. | 357/69 |
| 5,038,195 | 8/1991 | Brewer et al. | 357/70 |

FOREIGN PATENT DOCUMENTS

| | | | |
|---|---|---|---|
| 57-089950 | 6/1982 | Japan . | |
| 61-198766 | 9/1986 | Japan | 357/70 |
| 62-002643 | 1/1987 | Japan . | |
| 62-210660 | 9/1987 | Japan | 357/70 |
| 63-237425 | 10/1988 | Japan . | |

Primary Examiner—John Zimmerman
Attorney, Agent, or Firm—Bucknam and Archer

[57] ABSTRACT

A tape carrier having a connection function prepared by etching a metal foil to form an conductive pattern comprising outer leads and inner leads on a starting tape carrier and then providing, by plating, the connection portion of at least one group of said outer and inner lead groups with nodules for connecting said at least one group of the leads to a mating conductive pattern via the nodules.

9 Claims, 4 Drawing Sheets

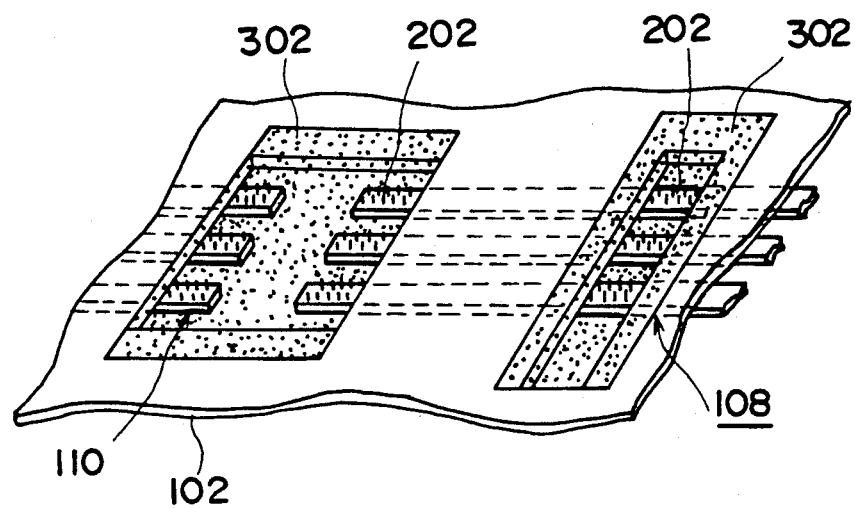
F I G. 3
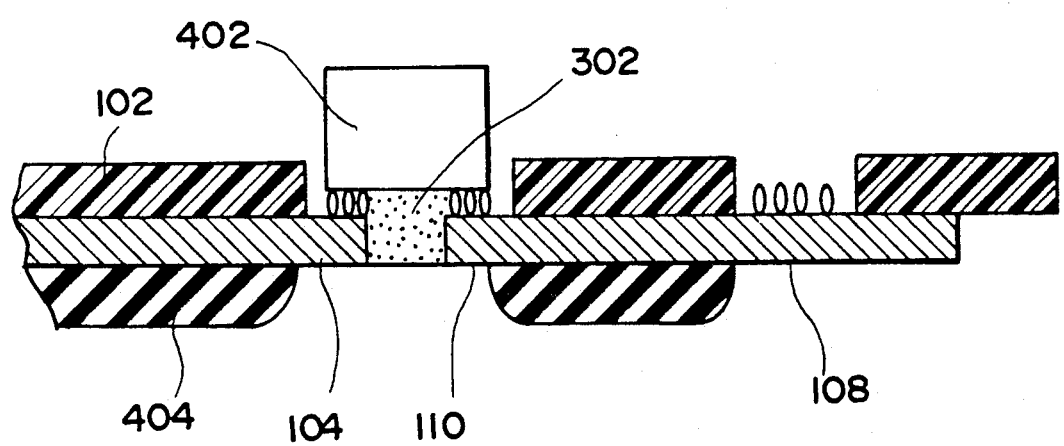
F I G. 4

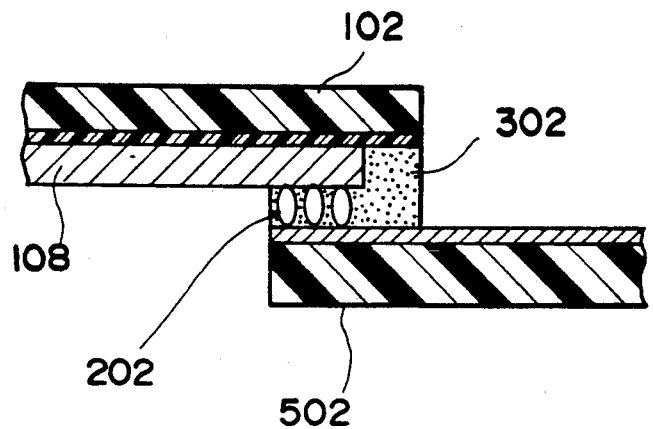
F I G. 5
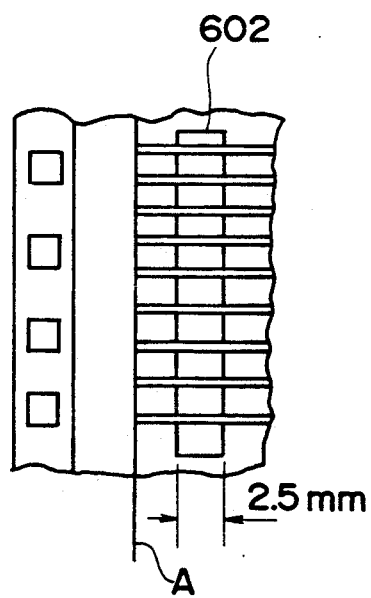
F I G. 6(a)

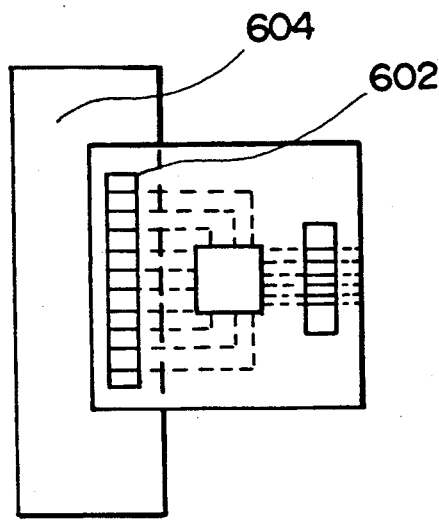
F I G. 6(b)

TAPE CARRIER HAVING CONNECTION FUNCTION

BACKGROUND OF THE INVENTION

1. Field of the Invention

The present invention relates to a tape carrier (TAB) used for, e.g., mounting an IC thereon and, more particularly, to a tape carrier having a connection function which enables the connection mechanism of a TAB to be simplified and made further fine by attaching nodules to the conductive pattern portion of the TAB and connecting this pattern portion to that of a mating or another substrate by an adhesive via these nodules.

2. Description of the Prior Art

In the case of a conventional connection of a TAB to another material, the outer lead portion of the TAB is connected to the conductive pattern of an LCD or another rigid substrate by an anisotropic conductive film or soldering. The inner lead portion of the TAB is normally Sn-plated and then heat pressure-bonded to an Au bump portion on an IC, thereby effecting therebetween a bond or connection in the form of an Au-Sn eutectic.

FIG. 7 (Prior Art) is a sectional view showing a tape carrier wherein an IC is connected to the inner leads of a TAB, and an LCD (a liquid crystal display device or a liquid crystal panel) and a rigid substrate are connected to the outer leads thereof. As shown in FIG. 7, the inner leads 708 of a Cu pattern 706 formed on a polyimide film 704 of a TAB 702 are connected to an IC 712 via Au bumps 710. Outer leads 714 are connected to a rigid substrate 716 by soldering. Other outer leads 718 are connected to a liquid crystal panel 722 via an anisotropic conductive film 720. A resin mold 724 is applied to the IC 712 after these connections were made. Reference numeral 726 denotes an insulating resist ink.

There is also known a method for connecting the Sn-plated inner leads of a TAB to an IC by etching the inner leads to form projections on the TAB side, followed by Au-plating the thus formed projections in place of forming the Au bumps on the IC side, and then heat pressure-bonding the IC to the Au-plated projections while forming an Au-Sn eutectic therebetween.

The prior art connection method using an anisotropic conductive film allows the density of leads of a conductive pattern at a connection portion to be generally 5 leads/mm, while no densities greater than this density have actually been used for connection of the conductive pattern, and it is limited to make structurally fine a circuit such as an LCD to which the conductive pattern is to be connected. The density of leads at a connection portion is hereinafter sometimes called "connection density" for brevity.

In addition, a connection method using soldering enables a connection between electrode patterns having a pitch of about 0.5 mm at smallest between adjacent leads; if it is attempted to connect electrode patterns having a pitch not larger than 200 μm are attemped to be connected to each other then a special equipment such as a laser soldering apparatus will be required and, in this case, there is needed a flux which will raise problems as not only as to the number of steps of washing but also its residue.

A method utilizing heat pressure-bonding via Au bumps needs the Au bumps to be formed, resulting in the occurrence of a high cost and poor versatility. In addition, since the heating temperature used in this method is as high as 450° C., the materials and tools to be used are limited. Furthermore, a problem as to a whisker caused by Sn plating is also posed. When projections are to be formed on the side of a TAB, etching for forming the projections will be difficult to achieve if the leads are formed at a fine pitch in the TAB.

Furthermore, when the connection illustrated in FIG. 7 is to be performed, three different apparatuses, i.e., an IC pressure-bonding machine, a soldering apparatus, and an anisotropic film heat pressure-bonding apparatus must be equipped.

SUMMARY OF THE INVENTION

It is an object of the present invention to provide a tape carrier which can perform connections at a higher connection density by a simple equipment and processes in view of the conventional problems.

The above object may be achieved by the provision of a tape carrier comprising outer and inner leads, wherein the connection portion of at least one of groups consisting respectively of the outer and inner leads is provided with a large number of nodules formed by plating, and at least this one group of the leads is connected to a mating conductive pattern via the nodules.

Other features and advantages of the invention will be apparent from the following description taken in connection with the accompanying drawings.

In case of the connection of inner or outer leads, an epoxy adhesive sheet is temporarily attached to a nodules-provided portion of the leads where the connection is to be effected, and a mating IC, liquid crystal panel or the like is then heat pressure-bonded to said portion thereby fixing the connection by said adhesive simultaneously with securing electrical connections via the nodules. The nodules can be easily formed on the lead portion of a TAB as Cu or Au nodules by using a copper sulfate plating bath, a copper pyrophosphate plating bath, an Au plating bath or the like. Therefore, all the problems in the conventional manufacturing processes can be solved, and the connection can be easily attained by use of only a heat pressure-bonding apparatus. In an IC mounting operation, the pressure bonding time is one sec. when a conventional method using heat pressure-bonding (eutectic formation) is employed, while it is about 20 sec. when the tape carrier of the present invention is used. Thus, in some cases, nodules are formed on only outer leads for connection purposes, and inner leads are connected by a conventional method.

BRIEF DESCRIPTION OF THE DRAWINGS

FIG. 3 is a schematic view showing the status wherein adhesive sheets are temporarily attached respectively to the inner and outer lead portion of a TAB;

FIG. 4 is a sectional view showing the status wherein the inner lead portion of the TAB shown in FIG. 1 is nodular-connected to an IC;

FIG. 5 is a sectional view showing the status wherein an outer lead portion of the TAB shown in FIG. 1 is nodular-connected to a substrate;

FIG. 6(a) and 6(b) are respectively a partial plan view of the outer lead portion of the TAB prepared in Example 1, and a plan view showing the status wherein the TAB is connected to a glass substrate.

DETAILED DESCRIPTION OF THE PREFERRED EMBODIMENTS

Figure 1:
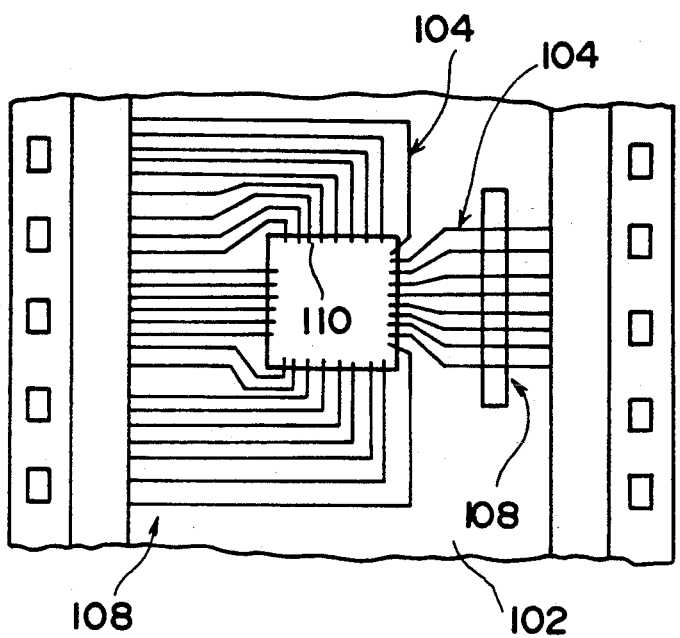
FIG. 1 is a schematic plan view showing a TAB embodying the present invention.

FIG. 1 is a schematic plan view showing a TAB according to the embodiment of the present invention. In FIG. 1, reference numeral 102 denotes a polyimide film substrate having a thickness of 75 to 175 μm; 104, a gold-plated Cu conductive pattern formed on the film substrate 102; 108, outer leads of the pattern; and 110, inner leads of the pattern.

Figure 2:
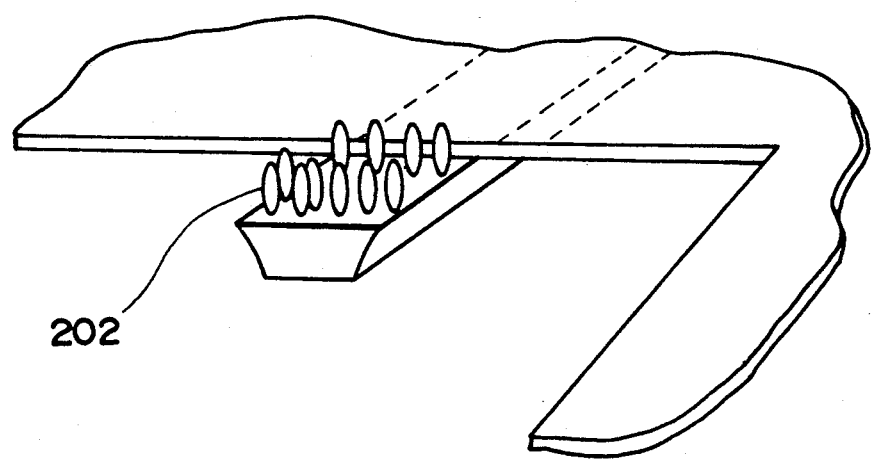
FIG. 2 is a schematic view showing the status wherein nodules are formed on the connection portion of inner leads.
Figure 7:
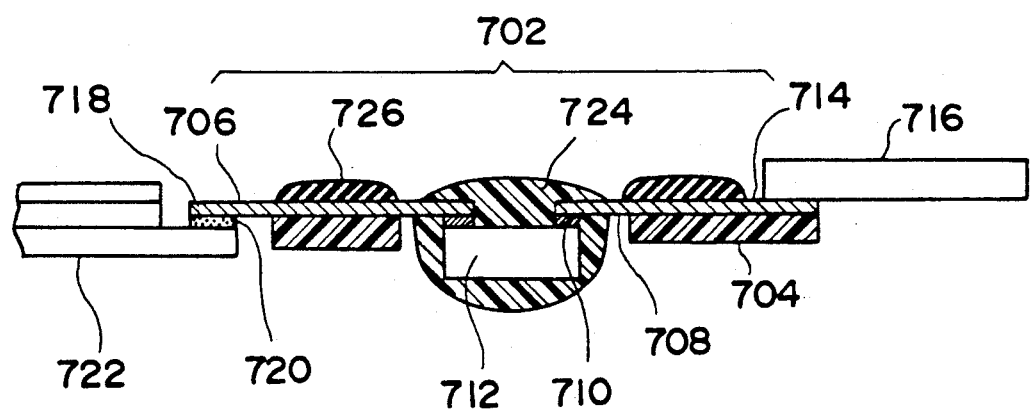
FIG. 7 is a sectional view showing a connection method according to the prior art.

As schematically shown in FIG. 2, dendritic nodules 202 each having a height of 10 to 15 μm are formed on the connection portion of the inner leads. The nodules are normally formed by plating a TAB in a resist-printed state after the conductive pattern 104 is formed by etching in the course of manufacture of the TAB. The plating is effected using a copper sulfate plating bath, a copper pyrophosphate plating bath, a gold cyanide plating bath, or the like, thus forming Cu or Au nodules. The thus formed nodules are normally subjected to Ni plating and then Au plating.

In case of connection, as shown in FIG. 3, epoxy adhesive sheets 302 are temporarily attached to the connection portions of the inner and outer leads 110 and 108 where the nodules are formed. As shown in FIG. 4, connection portions of IC 402 are then placed in position with respect to the connection portions of the inner leads 110, and are heat pressure-bonded thereto, and as shown in FIG. 5, connection portions of another substrate 502 are placed in position with respect to the connection portions of the outer leads, and are heat pressure-bonded thereto, thus fixing the connection portions and attaining good electrical connections. Temperatures, pressures, and application times required for the temporary adhesion of the adhesive and the heat pressure-bonding are normally 100° C., 5 kg/cm², and 2 to 3 sec., and 180° C., 30 kg/cm², and 20 sec., respectively. In this case, a liquid adhesive may be used, and a thermosetting or thermoplastic adhesive may be selected according to use conditions. The thickness of an adhesive film used preferably falls within a range of about 15 to 40 μm.

The heat pressure-bonding is performed in such a manner that after the adhesive is completely melted by heating and pressing with a heat pressure-bonder and nodules are brought into direct contact with a conductive pattern to be connected thereto, the resultant structure is cooled under pressure.

In this embodiment, the nodules are formed after the conductive pattern is formed by etching on the polyimide film serving as the tape carrier. Instead, nodules may be formed in advance on a copper foil (by rolling or electrolysis) as a material for the conductive pattern of the TAB, and the copper foil may be adhered to a polyimide film or a glass epoxy substrate to prepare a laminated sheet of a PCB, a TAB or an FPC. More specifically, the adhered copper foil with nodules may be etched to form a circuit having nodules at connection portions of the conductive pattern, and the nodules may also be subjected to Ni undercoating and then gold plating, thus forming, e.g., a printed circuit board with a nodular-connection function. The formation of nodules on a metal foil, such as a copper foil, may be achieved by using a technique of electroplating with copper as illustrated below in detail. The plating bath is a copper sulfate bath containing 90-110 gr/l of sulfuric acid and 7-9 gr/l of copper and is operated at a current density of 5-30 A/dm² for 3-10 min. and then at 1-5 A/dm² for 1-10 min. The height of nodules obtained will be controlled by current density and plating time. The plating bath may be incorporated with β-naphthoquinoline or α-anthraquinoline in an amount of 20-300 ppm and, in this case, a current density may be in the range of 50-150 A/dm² and plating time may be in the range of 10-30 seconds. Articles to be plated (such as a FPC or TAB) are immersed in the copper sulfate solution of the bath (which may be incorporated with additives) and a phosphorus-containing copper anode is used as such, after which a predetermined amount of current is allowed to pass through the solution. The nodules are formed only at the connection portion of the FPC or TAB and, to this end, the other portion at which no nodules are formed is coated with a resist ink or the like. The nodules so formed should have a height of 10-25 μm for practical use and they are required to have substantially the same height and to be distributed uniformly on the conductor. As required, the thus formed nodules are then plated with Ni to a depth of 1-7 μm to securely fix them to the conductor and further plated with Au to a thickness of 0.1-0.5 μm to protect the surface of the nodules. Such nodules can also be formed on a fine-pitch (63 μm pitch for example) pattern.

The present invention will be better understood by the following Examples and Comparative Example.

EXAMPLE 1

Dendritic Cu precipitates (nodules) were formed on a TAB having 450- and 200-μm pitch outer leads by use of a copper sulfate plating bath, thereafter Ni-plated and then Au-plated thereby to prepare a tape carrier having a connection function as shown in FIG. 1. The plating operations were performed under the conditions summarized in the following Table 1.

TABLE 1

| | Current Density | Time | Temperature | Thickness of Plate | Plating Bath |
|---|---|---|---|---|---|
| Cu Plating | 70 A/dm² | 15 sec. | Normal Temperature | 10 μm | Copper Sulphate Plating Bath Containing 100 gr/l of H₂SO₄ and 5 gr/l of Cu |
| Ni Plating | 3 A/dm² | 180 sec. | 55° C. | 3 μm | Sulphamic Acid Ni Bath |
| Au Plating | 1 A/dm² | 45 sec. | 65° C. | 0.5 μm | Gold Cyanide Bath Having Au Concentration |

TABLE 1-continued

| Current Density | Time | Temperature | Thickness of Plate | Plating Bath |
|---|---|---|---|---|
| | | | | of 8 gr/l |

The nodules-provided outer lead portion of the thus obtained tape carrier having 200-μm pitch outer leads (a lead width=100 μm, and a gap width=100 μm) was then connected to a glass substrate, 1.0 thick×8×20 (mm), on which an ITO film was vapor deposited, by heat pressure-bonding via a 25-μm thick epoxy thermosetting adhesive film, thus securing electrical connections between the two conductors. The ITO film of the glass substrate was adhered on the entire surface thereof and was not particularly patterned. The heat pressure-bonding was performed using a pulse heat type heat pressure-bonder TCW-125 (available from Nippon Avionics Co., Ltd.) as follows. The two conductors were pressed together at a pressure of 30 kg/cm² and a temperature of 180° C. for 20 sec. to melt the adhesive simultaneously with the nodules and the ITO film being directly pressed to be brought into contact with each other for bonding. Then, a compression tool (a length=100 mm and a width=3 mm) used was air-cooled while keeping the pressure to cure the adhesive, thus completing the connection. When this heat pressure-bonding was effected, a 100-μm thick Teflon film was inserted between the TAB and the tool so that the tool did not directly contact with the adhesive. The connection portion of the outer leads corresponded to a portion where a window portion 602 shown in FIG. 6(a) was formed, and the TAB was cut along a line A outside the connection portion and then placed in position with respect to a glass substrate 604, as shown in FIG. 6(b), thus effecting the connection.

Then, a cold-hot cycle test was conducted for 80 cycles within a temperature range of −40° C. to 100° C. for 30 minutes using a tester NT-500 available from Kusumoto Kasei Co., Ltd. The contact resistance was measured by a digital multimeter. As a result, an initial value of the contact resistance was 0.01 Ω/mm², while a value after 80 cycles was 0.2 Ω/mm². These values were each an average value of 20 outer leads.

EXAMPLE 2

A tape carrier was prepared following substantially the same procedures as in Example 1, except that a gold potassium cyanide solution having an Au concentration of 8 gr/l was used as the plating bath, and the plating was performed at a current density of 20 A/dm² and a temperature of 65° C. for 45 sec. to form Au nodules having a height of 10 μm, and a cold-hot cycle test was conducted by the same method as in Example 1. As a result, an initial value of the contact resistance was 0.01 Ω/mm², and a value after 80 cycles was 0.2 Ω/mm².

COMPARATIVE EXAMPLE 1

Connection was performed using the same tape carrier and glass substrate as those in Example 1 except that connection was performed without forming nodules but using an anisotropic conductive film formed of a thermosetting adhesive, and the same cold-hot cycle test was then conducted. As a result, an initial value of the contact resistance was 1.0 Ω/mm², while a value after 80 cycles was 15.7 Ω/mm².

It was found from the foregoing results that the tape carriers connected via nodules in Examples 1 and 2 exhibited a smaller initial contact resistance and suffered from a smaller increase in contact resistance after 80 cycles than those of Comparative Example 1 which was connected using the anisotropic conductive film. Therefore, the tape carriers having a specific connection function (nodular connection) prepared in Examples 1 and 2 could be used with high reliability.

As described above, according to the present invention, the formation of nodules on the connection portion of the inner and/or outer leads of a tape carrier will enable finer-pitch connections to be effected through more simplified processes and by more simplified equipment. More specifically, the inner leads and an IC can be connected to each other without forming Au bumps which result in an increase in cost and poor versatility. Since the nodules are very small and can be formed regardless of the pitch of the electrode pattern, there can be effected a fine-pitch connection, e.g. a 70 μm-pitch connection, whose pitch is finer than a 200 μm-pitch connection which is the finest-pitch connection attainable by use of an anisotropic conductive film. By exchanging a heat pressure-bonding tool, connections can be done by only a heat pressure-bonding apparatus. The heat pressure-bonding temperature is as low as 150° to 180° C. as compared to 400° C. or more in the conventional method utilizing an Au-Sn eutectic, and the pressure can also be as low as 20 gr/pin (nodules formed inner lead). Therefore, limitations on materials used and the like can be reduced, and versatility can be improved. Furthermore, since no soldering is required, no problem of a flux residue is posed, and a problem of whiskers caused by Sn plating can also be solved.

What is claimed is:

1. A tape carrier having a connection function prepared by etching a metal foil to form a conductive pattern comprising outer leads and inner leads on a starting tape carrier, then providing, by plating, a connection portion of at least one group of said outer and inner lead groups with nodules for connecting said at least one group of the leads to a mating conductive pattern via the nodules, and then applying a thermosetting or thermoplastic adhesive between the nodules formed portion and said mating conductive pattern and thermo-compressive-bonding the conductive patterns to each other.

2. A tape carrier having a connection function according to claim 1, wherein said nodules are Cu or Au and have a height of 3-25 μm.

3. A tape carrier having a connection function according to claim 2, wherein said nodules are dendritic Cu precipitates obtained from a copper sulfate plating bath.

4. A tape carrier having a connection function according to claim 7, said Au nodules are obtained from a gold cyanide plating bath.

5. A tape carrier according to claim 2, wherein said Cu or Au nodules are plated with Ni and then with Au to fix said nodules on the leads.

6. A tape carrier according to claim 3, wherein said plating bath is partly operated at a current density of 5-30 A/dm².

7. A tape carrier according to claim 3, wherein said plating bath is incorporated with a member selected from the group consisting of β-naphthoquinoline and α-naphthoquinoline and is partly operated at a current density of 50–150 A/dm$^2$.

8. A tape carrier according to claim 4, wherein said plating bath is partly operated at a current density of about 20 A/dm$^2$.

9. The tape carrier according to claim 1, wherein said thermo-compressing bonding is carried out at a temperature of 100°–180° C. and a pressure of 5 kg/cm$^2$ up to 30 kg/cm$^2$ for 2–20 seconds.

* * * * *